United States Patent [19]

Sparks et al.

[11] Patent Number: 5,985,761
[45] Date of Patent: Nov. 16, 1999

[54] METHOD OF MAKING AN INTEGRATED CIRCUIT STRUCTURE WITH PLANARIZED LAYER

[75] Inventors: Eric A. Sparks, San Jose, Calif.; Stacy W. Hall, San Antonio, Tex.

[73] Assignee: VLSI Technology, Inc., San Jose, Calif.

[21] Appl. No.: 08/666,802

[22] Filed: Jun. 19, 1996

Related U.S. Application Data

[62] Division of application No. 08/561,768, Nov. 22, 1995, Pat. No. 5,640,038.

[51] Int. Cl.⁶ .................................................. H01L 21/44
[52] U.S. Cl. .................... 438/669; 438/671; 438/696; 438/720; 438/725; 438/738; 438/742
[58] Field of Search .................................. 438/669, 671, 438/696, 720, 725, 738, 742

[56] References Cited

U.S. PATENT DOCUMENTS

| 4,818,715 | 4/1989 | Chao ........................................ 438/585 |
| 5,003,062 | 3/1991 | Yen .......................................... 437/231 |
| 5,061,647 | 10/1991 | Roth et al. .............................. 438/596 |
| 5,210,435 | 5/1993 | Roth et al. .............................. 257/344 |
| 5,317,192 | 5/1994 | Chen et al. ............................. 247/750 |
| 5,368,686 | 11/1994 | Tatsumi et al. ......................... 438/696 |
| 5,479,054 | 12/1995 | Tottori .................................... 257/752 |
| 5,502,324 | 3/1996 | Hachisuka et al. ..................... 257/384 |
| 5,505,322 | 4/1996 | Shinohara et al. ..................... 438/720 |
| 5,569,627 | 10/1996 | Shinohara et al. ..................... 438/669 |
| 5,578,163 | 11/1996 | Yachi ...................................... 438/720 |
| 5,599,743 | 2/1997 | Nakagawa et al. .................... 438/669 |
| 5,679,213 | 10/1997 | Noshiro .................................. 438/669 |
| 5,741,742 | 4/1998 | Kamide ................................... 438/696 |
| 5,767,018 | 6/1998 | Bell ........................................ 438/696 |
| 5,772,906 | 6/1998 | Abraham ................................ 438/740 |

FOREIGN PATENT DOCUMENTS 3-171671 7/1991 Japan .
2251722A 7/1992 United Kingdom .

OTHER PUBLICATIONS

Wolf et al., Silicon Processing For The VLSI era, vol. 1, Lattice Press, 1986, pp. 545–557.

Primary Examiner—John F. Niebling
Assistant Examiner—Lynne A. Gurley
Attorney, Agent, or Firm—Hickman Stephens & Coleman, LLP

[57] ABSTRACT

An integrated circuit structure includes a conductive layer, a first dielectric layer overlying the conductive layer, a second dielectric layer overlying both the first dielectric layer and the conductive layer and a planarizing layer overlying the second dielectric layer. The conductive layer has a lateral dimension which is greater than a corresponding lateral dimension of the first dielectric layer. Thus the conductive layer and the first dielectric layer form a stepped, pyramidal shaped island. As a result of the stepped, pyramidal shape, the overlying planarizing layer forms with a more planar upper surface than if the sidewall of the island had a vertical profile. In one preferred embodiment of the present invention, the conductive layer is formed from tungsten-silicide, and both of the dielectric layers are either silicon dioxide or silicon nitride.

19 Claims, 6 Drawing Sheets

METHOD OF MAKING AN INTEGRATED CIRCUIT STRUCTURE WITH PLANARIZED LAYER

This is a divisional of application Ser. No. 08/561,768 filed on Nov. 22, 1995, now U.S. Pat. No. 5,640,038.

BACKGROUND OF THE INVENTION

The present invention relates generally to integrated circuits, and more particularly, to self-planarizing layers formed on an integrated circuit.

During mass production of integrated circuits, a number of well defined regions of a semiconductor wafer become individual, yet circuits normally involves forming one or more layers over the semiconductor wafer, and then patterning these layers. Since the desired integrated circuits are identical, fabrication is made efficient by forming these layers over the entire semiconductor wafer and then performing subsequent processing steps simultaneously to each integrated circuit. These processes are often repeated until all the elements necessary are formed on each integrated circuit.

Wafer etching is a processing step used at many points in mass production of integrated circuits. The general term etching is used to describe techniques by which material can be removed from layers formed over a semiconductor wafer. The etching process, in conjunction with masking and cleaning processes, is often used to pattern layers of a semiconductor wafer.

As is well known to those of skill in the art, etching is typically divided into two categories; wet etching and dry etching. Dry etching, rapidly becoming the most popular etching method within the industry, involves removal of material by momentum transfer from ion bombardment, subjection of the wafer to a reactive chemical species, or a combination of the two. The dry etch process which combines both methods is known as reactive ion etching. In reactive ion etching, the semiconductor wafer is exposed to a plasma and a bias voltage is forced on the wafer to accelerate ions present in the plasma towards the wafer. The plasma is typically formed from an inert gas and the chemically reactive species.

FIG. 1 illustrates a prior art reactive ion etcher 10. The reactive ion etcher 10 includes etchant chemical plumbing 12 and control valves 14, coolant plumbing 16 and a corresponding control valve 18, a radio frequency (rf) generator 20, and a housing chamber 22. A showerhead 24 and chuck 26 are both internal to the chamber 22. Typically a semiconductor wafer 28 is mounted on the chuck 26. Additionally, the walls of the chamber 22 and either the chuck 26 or the showerhead 24 are electrically coupled to ground. When operating, the rf generator 20 creates a positive charge (hence creating an anode) on the larger electrode and a negative charge (hence creating a cathode) on the smaller electrode. As should be apparent, the electrode which is attached to the walls of the chamber 22 (either the chuck 26 or the showerhead 24) is the electrode of large area.

The etching process often includes a non-powered step and a powered step. In the non-powered step, the chamber 22 is filled with etchant chemicals according to a specific etch recipe while the rf generator 20 is off. Once the chamber 22 is prepared, the rf generator 20 is turned on and then causes oscillations in the plasma cloud 30 creating ions and free electrons. The positive ions accelerate towards the cathode 26, thereby anisotropically etching the surface layers of the wafer 28.

During etching, the temperature of the semiconductor wafer 28 rises due to exposure to the plasma 22. In order to prevent overheating and maintain control of the etching process, a small amount of gaseous helium coolant is bled underneath the wafer 28 by way of the coolant chemical plumbing 16 and the corresponding valve 18. By way of explanation, the temperature of the wafer 28 may directly effect many of the etch parameters such as etch rate, undercut, and selectivity. Therefore it is desirable to control this temperature.

Prior art etch recipes include carbon chemicals, such as $CHF_3$ and $C_2F_6$. As is well know to those skilled in the art, etching processes which use reactive chemicals high in carbon are "dirty". Because of carbon residue left by such high carbon chemicals, maintenance tasks such as cleaning the etching chamber must be performed regularly in order for the chamber to function properly. This results in costly downtime for critical machinery.

As will be appreciated by those skilled in the art, reactive ion etching is primarily an anisotropic etching method. That is, reactive ion etching removes material in primarily one direction, as opposed to removing material uniformly in all directions.

FIG. 2 shows a cross-sectional view of a prior art integrated circuit structure 40 which was fabricated in part by a prior art recipe using $CHF_3$ and $C_2F_6$. The integrated circuit structure 40 includes a semiconductor substrate 42, an island 43 comprised of a conductive layer 44 and an oxide layer 46, an inter-level dielectric (ILD) layer 48, and a spin-on glass (SOG) layer 50. While only one island 43 is shown in FIG. 2, typically the integrated circuit structure 40 has a plurality of islands 43, and the integrated circuit structure 40 is one of a plurality of integrated circuit structures formed on a single semiconductor wafer. The islands 43 are preferably formed by standard photolithography patterning processes.

Typical prior art etch recipes create a plurality of islands 43 formed from portions of the oxide layer 44 and the conductive layer 46, with each layer of a particular island 43 having lateral dimensions which are substantially the same. Hence, the sidewall profile of each island 43 is vertical. Note that FIG. 2 shows only a two-dimensional cross-sectional view of the island wherein the lateral dimensions of the conductive layer 44 and the oxide layer 46 are substantially the same. In actuality, the integrated circuit structure 40 has a depth dimension (i.e. the dimension which is perpendicular to the page), and the depth of each layer would also be substantially the same.

After the islands 43 are formed, two layers, an ILD layer 48 and a SOG layer 50 are applied over the oxide layer 46 where the ILD layer 48 is for insulation purposes and the SOG layer 50 serves to planarize the surface of the wafer for subsequent processing steps. In some cases a boron phosphate silicate glass (BPSG) planarizing layer may be used in lieu of the SOG layer 50. In either case, once the ILD layer 48 and the SOG layer 50 (or BPSG layer) have been formed, the integrated circuit structure 40 typically undergoes additional fabrication steps. Often additional layers are formed and are in turn patterned. In order to perform these subsequent steps, the upper surface 52 of the SOG layer 50 must be substantially planar. However, as can be seen from FIG. 2, the topography of the upper surface 52 is not substantially planar, rather it is especially "bumpy" in the area over the island 43. Consequently, a planarizing step such as polishing might have to be performed in order to form a planar upper surface 52 on the SOG layer 50. These additional processing steps are expensive and time consuming, and may result in reduced yield of functional integrated circuits.

SUMMARY OF THE INVENTION

The present invention achieves the aforementioned requirements through an integrated circuit structure which has a conductive layer, a first dielectric layer overlying the conductive layer, a second dielectric layer overlying both the first dielectric layer and the conductive layer and a planarizing layer overlying the second dielectric layer. The conductive layer has a lateral dimension which is greater than a corresponding lateral dimension of the first dielectric layer. Thus the conductive layer and the first dielectric layer form a stepped, pyramidal shaped island. As a result of the stepped, pyramidal shape, the overlying planarizing layer forms with a more planar upper surface when it is applied than if the sidewall of the island had a vertical profile. In one preferred embodiment of the present invention, the conductive layer is formed from tungsten-silicide, and both of the dielectric layers are either silicon dioxide or silicon nitride.

Another aspect of the present invention provides a method for producing the integrated circuit structure disclosed above. This method begins by producing a conductive layer over a substrate. Following this, an insulating layer is formed over the conductive layer such that the conductive layer has a lateral dimension greater than a corresponding lateral dimension of the insulating layer. Thus the conductive layer and the first dielectric layer form a stepped, pyramidal shaped island. Subsequently, a second insulating layer is formed over the first insulating layer and the conductive layer, and a planarizing layer is formed over the second insulating layer. As the planarizing layer is deposited over the portion of the second insulating area which covers the pyramid shaped island, this layer forms such that it has a substantially more planarized top surface then if formed over the prior art island. In one preferred embodiment, the first dielectric layer is formed using a reduced-carbon residue method.

A preferred method for producing the stepped, pyramidal shaped integrated circuit structure begins by providing a semiconductor substrate. In following steps a conductive layer is formed over the substrate and an oxide layer is formed over the conductive layer. Then the oxide layer is masked with a resist material. The oxide layer is patterned by etching with a plasma formed, at least in part, from $SF_6$ and $CHF_3$ such that, as the oxide layer is removed, sidewalls are formed on said oxide layer. These sidewalls include a polymer deposited from the plasma and are formed as a result of the etch chemistry. Once the exposed oxide layer is removed, the conductive layer is etched using the oxide layer and the polymer sidewalls as a mask. Next, with both the conductive and oxide layers patterned, the resist and polymer are stripped from the oxide layer. The resultant etched oxide layer has a dimension which is less than a corresponding dimension of the etched conductive layer. Thus this method produces a stepped, pyramidal shaped structure.

These and other advantages of the present invention will become apparent upon reading the following detailed descriptions and studying the various figures of the drawings.

DETAILED DESCRIPTION OF THE PREFERRED EMBODIMENTS

Figure 1:
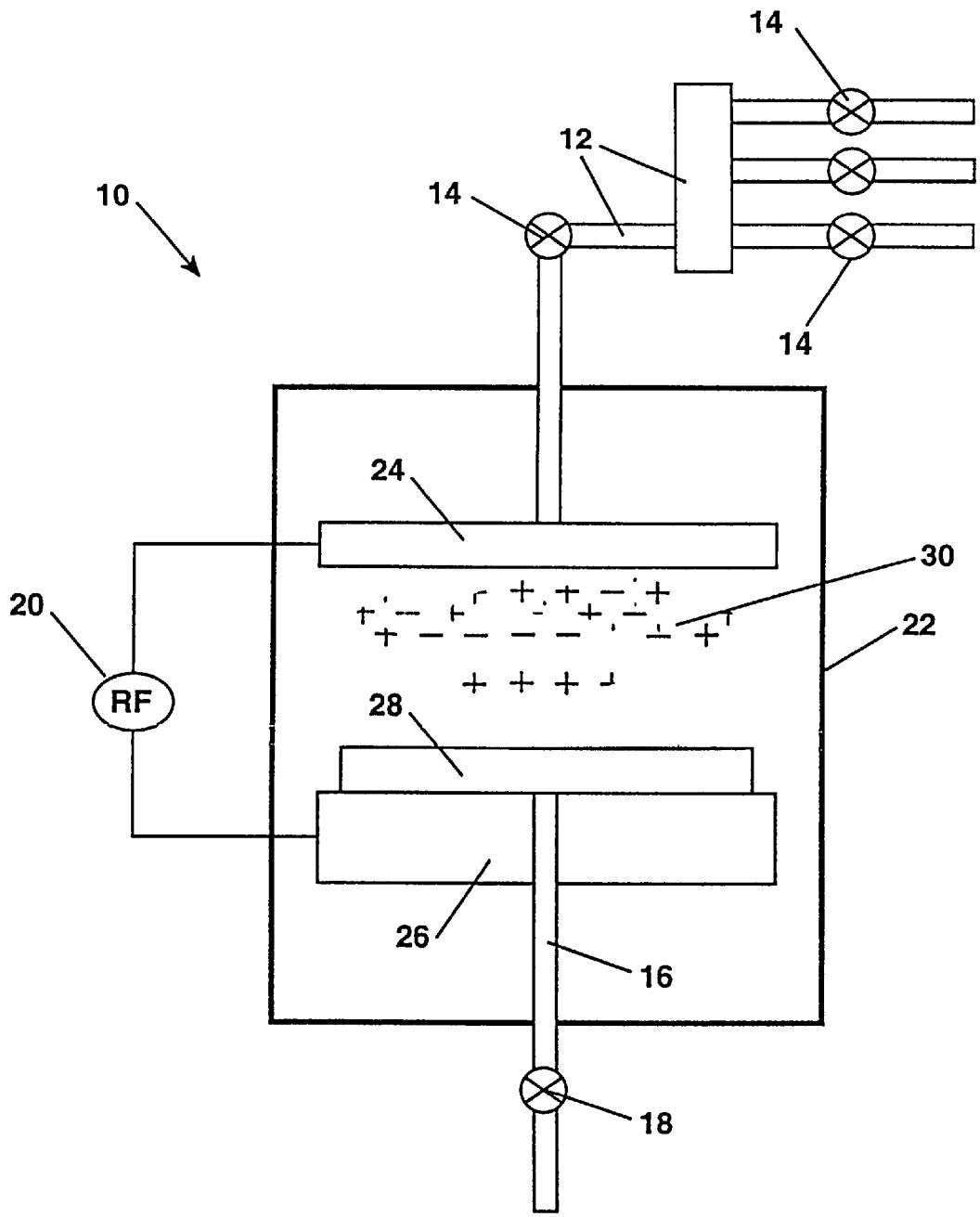
FIG. 1 is a pictorial view of a prior art reactive ion etching chamber.
Figure 2:
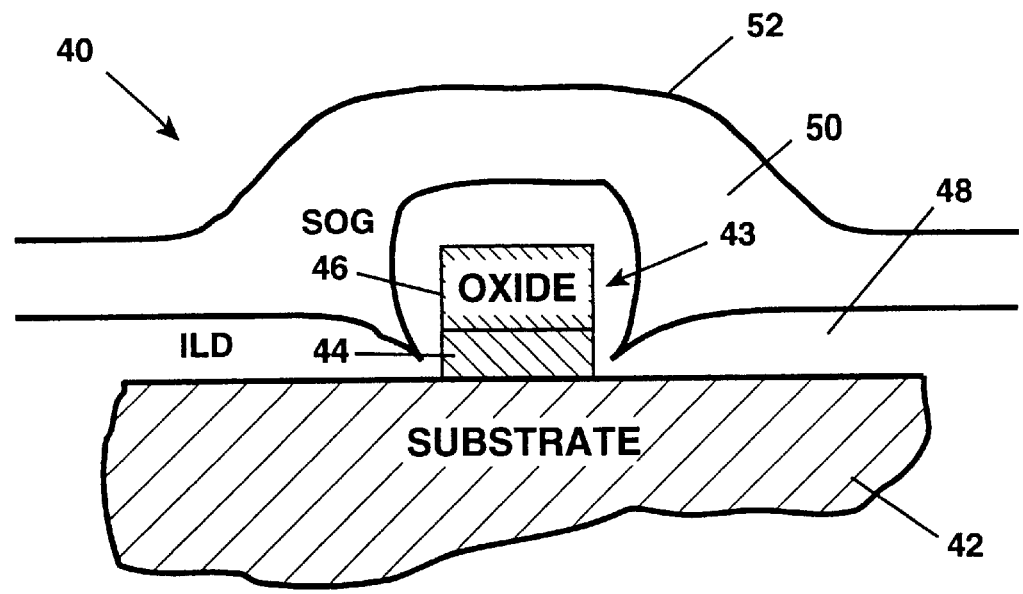
FIG. 2 is a cross-sectional view of a prior art integrated circuit structure fabricated with a prior art etch recipe.
Figure 3:
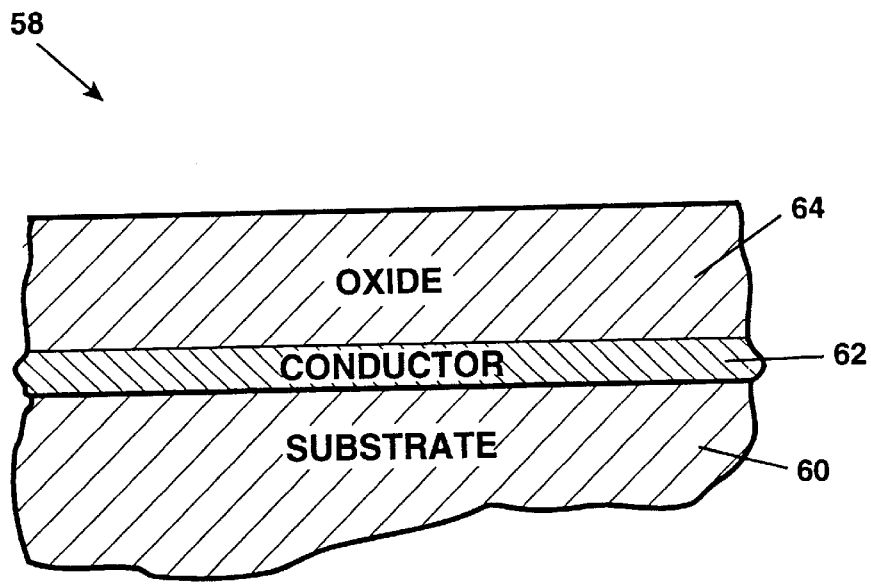
FIG. 3 is a cross-sectional view of the substrate, conductive layer, and dielectric layer of a partially fabricated integrated circuit in accordance with a first embodiment of the present invention.

FIGS. 1 and 2 show the prior art and were described previously. In FIG. 3, the process of the present invention begins with a partially fabricated integrated circuit structure 58 formed over a semiconductor substrate 60. Device elements not shown may be present in the substrate 60. For example, in the case of MOS based integrated circuits, typical device elements include sources, gates, and drains. Furthermore, additional layers may be formed and patterned over the substrate, serving to interconnect the device elements. As they are not pertinent to the description of the present invention and are well known to those skilled in the art, such additional device elements and additional layers are not further described herein.

In a first step of the present invention, a conductive layer 62 and a dielectric layer 64 are formed over the substrate 60 as illustrated in FIG. 3. It should be noted that the thickness of the dielectric layer 64 is greatly exaggerated (relative to the conductive layer 64), and would typically be similar in thickness, or thinner, than the conductive layer 62. This exaggeration is done solely for demonstrative purposes in the subsequent illustrations, and it will be readily apparent to one skilled in the art how the actual integrated circuit would be formed.

As will be appreciated by those of skill in the art, the material used for the conductive layer and the dielectric layer as well as the thickness of each layer may be widely varied in accordance with the needs of the specific application. By way of example, aluminum, aluminum alloys, tungsten silicide, and titanium tungsten are appropriate materials for the conductive layer 62. This layer 62 may be applied by any suitable process such as reactive ion sputtering. For the dielectric layer, silicon dioxide is preferred and can be applied by chemical vapor deposition (CVD). For the conductive layer 62, a thickness in the range of about 1500–10,000 Å has been found to work well. One suitable construction for conductive layer 62 is a sandwich of several conductive layers including a tungsten silicide layer over a polysilicon layer. For an oxide dielectric layer 64, a thickness in the range of about 500–2000 Å is appropriate.

Figure 9:
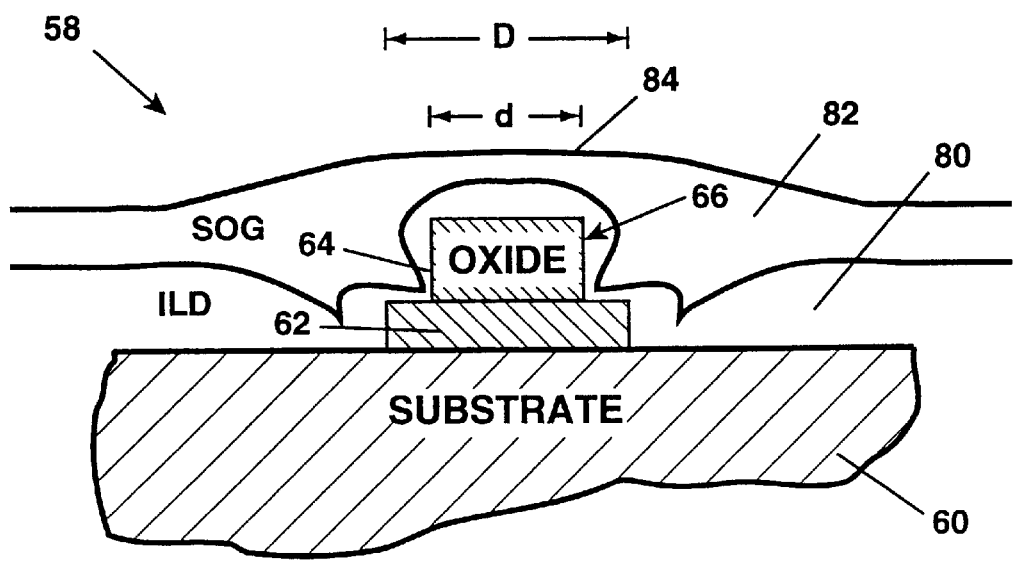
FIG. 9 is a cross-sectional view of the integrated circuit after inter-level dielectric and spin on glass layers have been formed, which is juxtaposed with FIG. 2 to emphasize the difference in planarity between the structure of the present invention and the prior art.

After the conductive layer 62 and the dielectric layer 64 have been formed, these layers are patterned to form a stepped, pyramidal shaped structure 66 as shown in FIG. 9. The pyramid shaped structure 66 is formed such that the conductive layer 62 has a lateral dimension "D" which is larger than a corresponding lateral dimension "d" of the dielectric layer 64.

Note that FIGS. 3–9 show only a two-dimensional cross-sectional view of the pyramid structure 66. In actuality, the integrated circuit structure 58 has a depth dimension (i.e. the dimension which is perpendicular to the page). While the following explicitly discusses lateral dimensions, it should be apparent that the structure also has a corresponding pyramid shape in the depth direction.

In a preferred process, the pyramid shaped structure 66 is formed by using an etch recipe that removes the unmasked portions of the oxide in a bulk etch step and subsequently forms masking sidewalls over a portion of the conductive layer during an overetch step. Then, the conductive layer is etched according to these masking sidewalls. Advantageously, the etch recipe used is low in carbon, resulting in a cleaner process.

Figure 4:
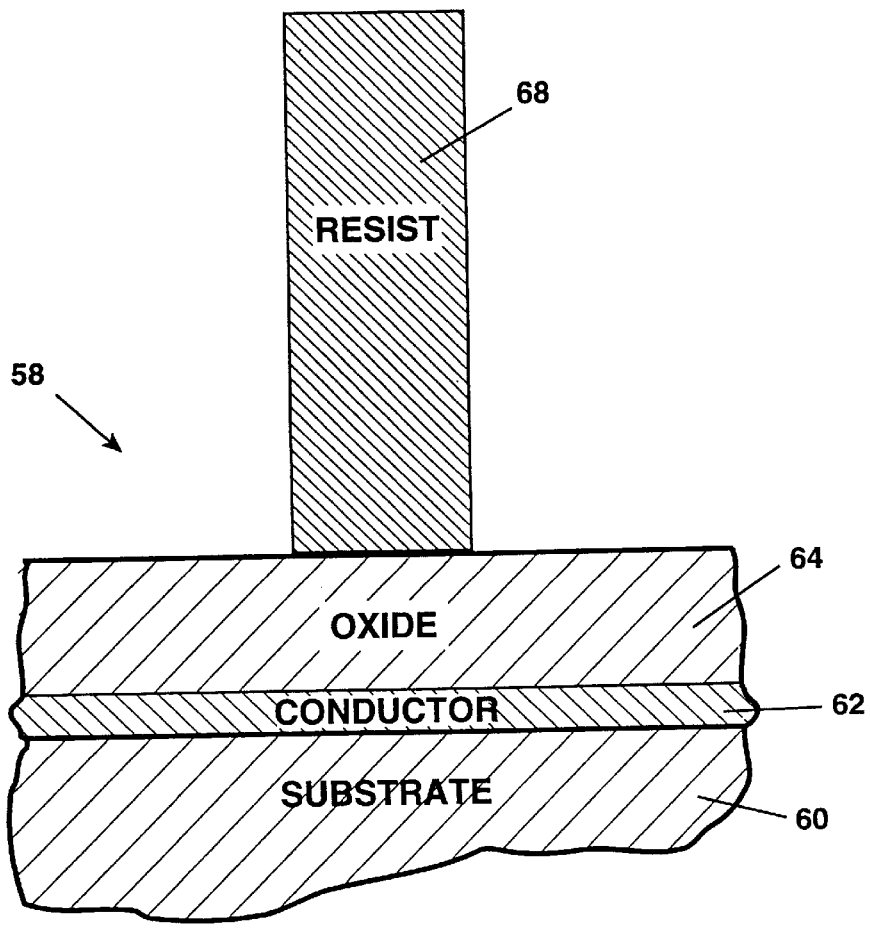
FIG. 4 is a cross-sectional view of the integrated circuit after a photoresist mask has been formed over the dielectric layer.

One specific preferred embodiment for making the pyramid shaped structure 66 will be discussed with respect to FIGS. 4–9. In a first step, a photoresist mask 68 is applied covering a portion of the dielectric layer 64 as seen in FIG. 4. The photoresist mask 68 can be applied using any suitable technique and typically has a thickness in the range of about 1–2.5 microns. Then, utilizing a reactive ion etch chamber similar to the one shown in FIG. 1, the following anisotropic etch recipe is used to remove portions of the oxide dielectric layer 62 and then build polymer sidewalls on the dielectric layer 62.

TABLE 1

Etch Recipe

| Step | 1 | 2 | 3 |
|---|---|---|---|
| Time (seconds) | 15 | 20 | 10 |
| $CHF_3$(SCCM) | 185 | 185 | 185 |
| $SF_6$(SCCM) | 15 | 15 | 15 |
| Ch Pr. | 240 | 240 | 240 |
| He Pr. | 10 | 10 | 10 |
| Power (Watts) | 0 | 300 | 300 |

In the above preferred etch recipe there are thee steps; Step 1 is a preparatory step, step 2 is a bulk etch step, and step 3 is an overetch step. In the preparatory step 1, the chamber 22 is allowed to fill with the reactive chemicals $CHF_3$ and $SF_6$. The preferred flow rates for $CHF_3$ and $SF_6$ are provided above in the units of standard cubic centimeters per minute (SCCM). Of course these flow rates may be varied and are provided only as one suitable embodiment. As will be appreciated by those of skill in the art, the amount of time required to prepare the chamber 22 can vary and the amount given in the table, 15 seconds, is provided only by way of example. Processes for monitoring the preparedness of the chamber 22 are well known to those skilled in the art of integrated circuit fabrication.

Figure 5:
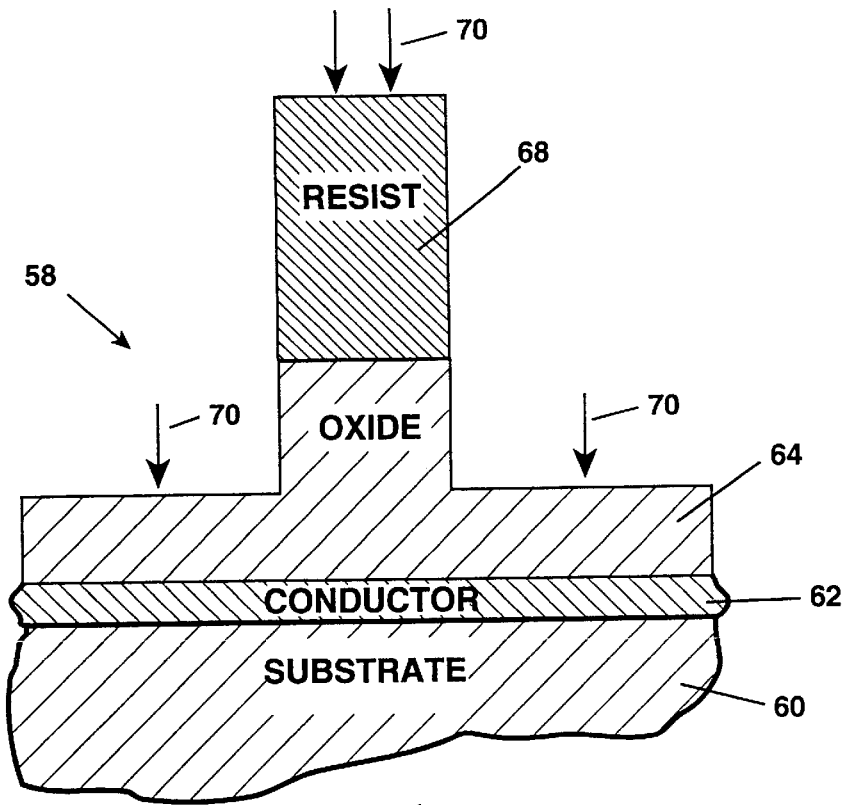
FIG. 5 is a cross-sectional view of the integrated circuit during a bulk etching process, with the arrows on this view indicating the anisotropic etch of one embodiment of the present invention.

The bulk etch step 2 begins when the rf generator 20 is turned on, thus starting the ion bombardment of the integrated circuit. FIG. 5 shows the appearance of the integrated circuit structure 58 during the bulk etch. The etch direction arrows 70 indicate the anisotropic nature of this etch process.

Figure 6:
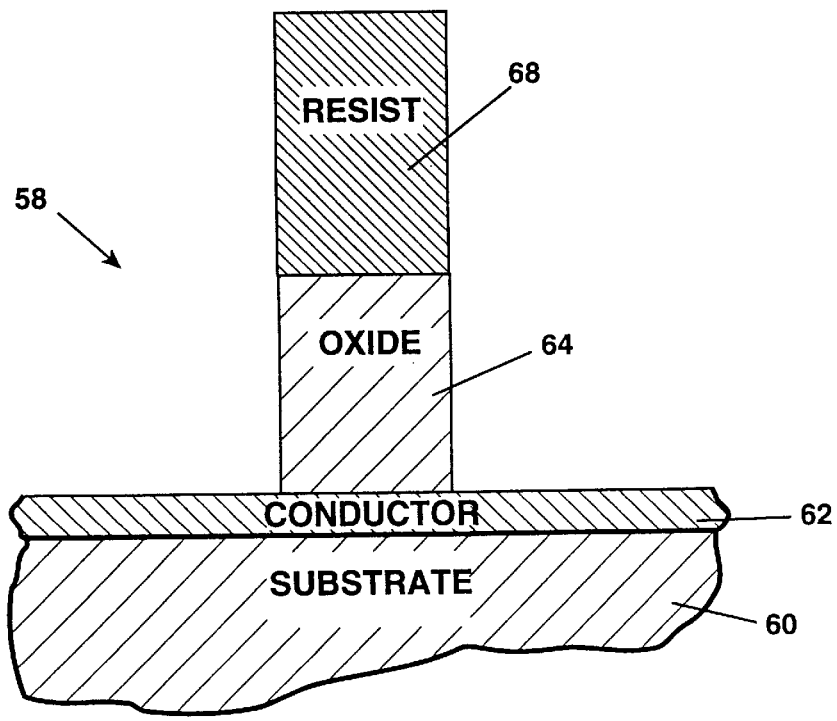
FIG. 6 is a cross-sectional view of the integrated circuit after the bulk etch has been performed.
Figure 7:
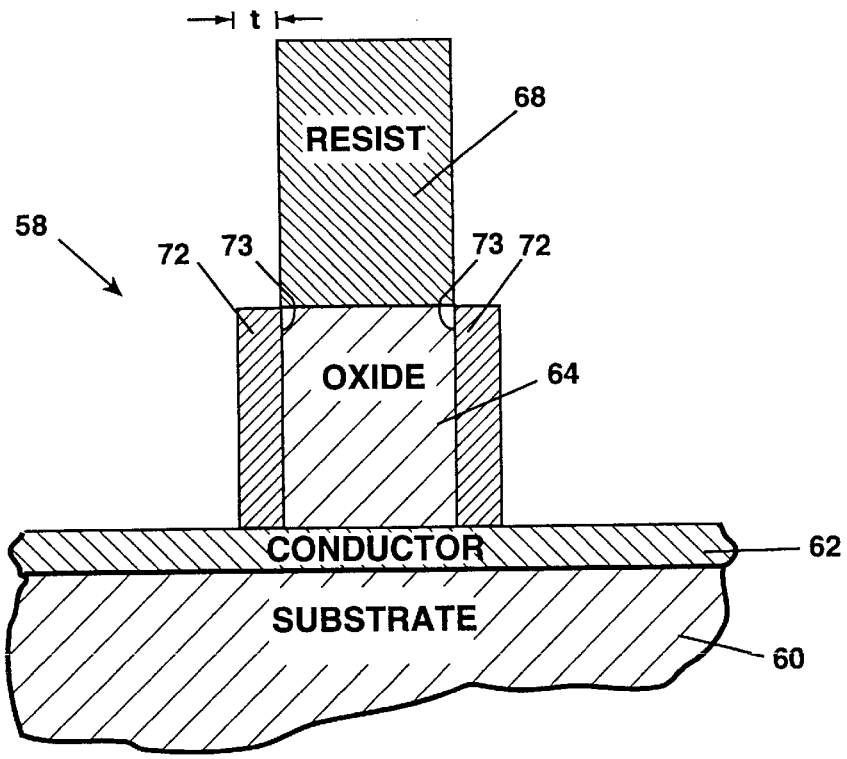
FIG. 7 is a cross-sectional view of the integrated circuit after an overetch process has been performed.

The bulk etch step 2 continues until the desired portions of the conductive layer 62 are fully exposed as shown in FIG. 6. As will be appreciated by those of skill in the art, the amount of time required to complete the bulk etch can vary depending upon a number of parameters such as the thickness of the dielectric layer 64, the temperature of the integrated circuit, and the concentration of the reactive chemicals. Furthermore, an appropriate end-point detection scheme such as an optical emission test can be used to ascertain when the bulk etch step 2 is completed. The amount of time given in the above table for the bulk etch step 2, 20 seconds, is provided by way of example.

Figure 8:
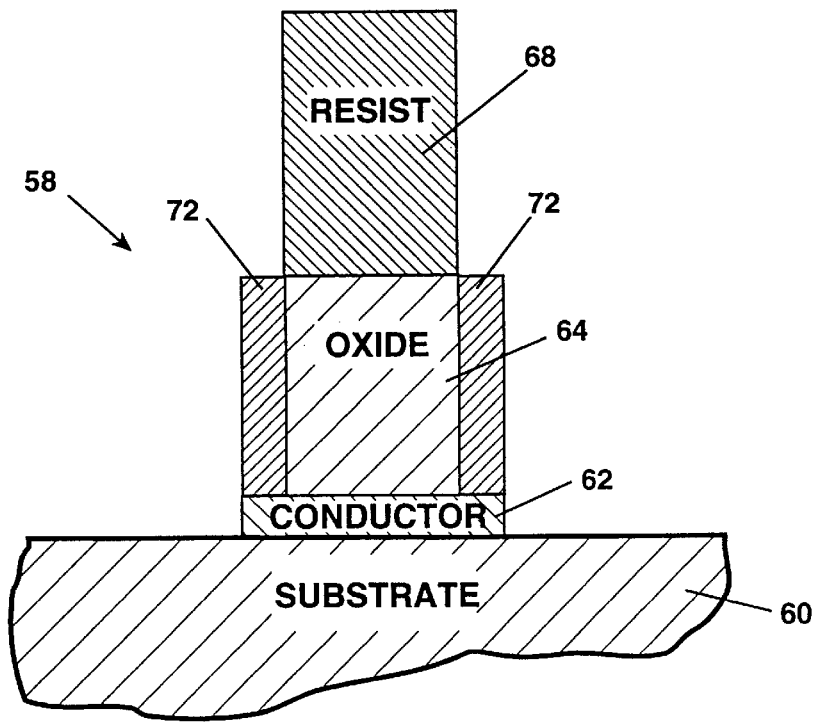
FIG. 8 is a cross-sectional view of the integrated circuit after the conductive layer has been etched.

Once the bulk etch step 2 is completed, the process continues with an overetch step 3. In the overetch step 3, the rf generator is kept on and polymer sidewalls 72 begin to grow out laterally from the exposed portions 73 of the oxide dielectric layer 64. Note that the sidewalls do not grow into the dielectric layer 64. That is, the portion of the dielectric layer 64 masked by the photoresist 68 remains substantially intact. The polymer sidewalls are an effect of the etch chemistry as described in greater detail hereinafter. When the polymer sidewalls 72 have grown to their desired width as shown in FIG. 8, the rf generator is turned off and the overetch step 3 is complete. The thickness of these walls can vary depending upon the desired geometry. For example, a thickness t in the range of 500–1000 Å has been found to work well.

It is believed that the polymer in the polymer sidewalls 72 is a carbon polymer formed from the gaseous reactive chemicals $CHF_3$ and $SF_6$, material removed from the photoresist layer 68, and perhaps other chemicals present in the plasma. It has been observed that the greater the concentration of $CHF_3$ in the plasma, the faster the polymer sidewalls 72 grow. Additionally, byproducts caused by the etching of oxide layer 64 tend to inhibit growth of the polymer sidewalls 72, hence the polymer sidewalls do not begin growing until the bulk etch step is complete, i.e., after the oxide layer 64 has been removed. Moreover, it has been observed that an increase in the thickness of the oxide layer 64 results in a corresponding widening of the polymer sidewalls 72 (all other parameters constant of course). Thus, as will be apparent to those of skill in the art, the amount of time required to grow the polymer sidewalls 72 can vary depending upon a number of factors including the aforementioned and others such as the desired width, the actual concentration and flow rates of the reactive chemicals, and the temperature of the integrated circuit structure 58. The amount of time given in the above table for the overetch step 3, 10 seconds, is provided only as an example of a typical period of time.

Once the polymer sidewalls 72 have been completed, a different etch process is used to remove the portions of the conductive layer 62 which are not covered by the masking polymer sidewalls 72 or the combination resist 68 and dielectric layer 64. The appearance of the integrated circuit structure 58 once the conductive layer 62 has been etched is shown in FIG. 8. After the patterning is complete, the photoresist layer 68 and the masking polymer sidewalls 72 can be stripped in one cleaning step. The resultant structure is the pyramid shaped structure 66 shown in FIG. 9.

Once the pyramid shaped structure 66 has been formed, subsequent layers can be applied. FIG. 9 shows the appearance of an integrated circuit structure 58 which includes an inter-level dielectric (ILD) layer 80 and a spin-on glass (SOG) layer 82. The ILD layer 80 has been formed overlying the substrate 60 and the pyramid shaped structure 66 and the SOG layer 82 has has been formed overlying the ILD layer 80. Note that the upper surface 84 of the present invention is significantly more planar than the equivalent upper surface 52 of the prior art integrated circuit of FIG. 2. The surface of the present invention is far more suitable for subsequent processing steps which may be part of fabricating the finalized integrated circuit structure 58. Furthermore, the preferred embodiment, which includes the given etch recipe, results in less carbon build-up within the reactive ion etching chamber.

Figure 10:
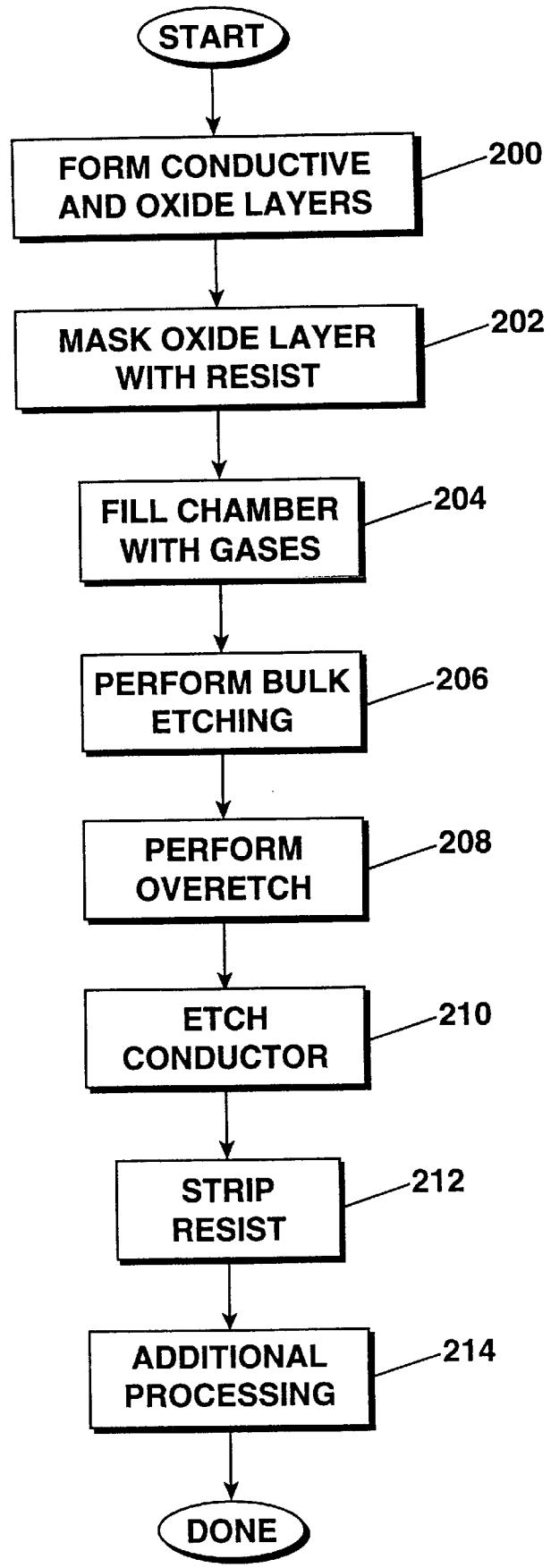
FIG. 10 is a flow diagram of a method for making an integrated circuit structure with planarized layers in accordance with the present invention.

One method aspect of the present invention will be summarized with respect to FIG. 10. The manufacturing process begins in step 200 where conductive and oxide layers are formed over the substrate. Then, in step 202, a photoresist mask is formed over the oxide layer. The oxide layer is etched and polymer sidewalls are formed in subsequent steps 204, 206, and 208, where, respectively, the rf chamber is filled with gases, the bulk etch is accomplished, and the overetch is performed. Preferably, etching is performed by a process which produces minimal carbon residue in the chamber. Next, in a step 210, the conductive layer is etched according to the photoresist mask and the polymer sidewalls. Then, in a step 212, the photoresist and the polymer sidewalls are stripped. Finally, in step 214, additional processing steps are performed. While the additional steps can include a variety of processes, the most relevant is the application of layers which tend to be self-planarizing due to the pyramid shaped structure of the present invention.

While this invention has been described in terms of several preferred embodiments, there are alterations, permutations, and equivalents which fall within the scope of this invention. For example, the gas chemistries of the preferred embodiment can be applied in making other components of the integrated circuit such as via holes and contact pads. It should also be appreciated that the photoresist layer, while having a low selectivity rate, may also be stripped during the dielectric layer etch.

It should also be noted that there are many alternative ways of implementing the processes of the present invention. It is therefore intended that the following appended claims be interpreted as including all such alterations, permutations, and equivalents as fall within the true spirit and scope of the present invention.

What is claimed is:

1. A process for producing an integrated circuit structure comprising the steps of:
   (a) producing a conductive layer over a substrate and a first insulating layer over said conductive layer such that said conductive layer has a first lateral dimension and said insulating layer has a second lateral dimension less than said first lateral dimension;
   (b) producing a second insulating layer over said first insulating layer and said conductive layer; and
   (c) producing a planarizing layer over said second insulating layer.

2. A process as recited in claim 1 wherein step (a) includes the steps of:
   depositing said conductive layer over said substrate;
   depositing said first insulating layer over said conductive layer;
   masking at least one portion of said first insulating layer; and
   etching said first insulating layer and said conductive layer such that said second lateral dimension is less than said first lateral dimension.

3. A process as recited in claim 2 wherein said step of etching said first insulating layer and said conductive layer comprises the steps of:
   etching said first insulating layer with a plasma formed, at least in part, from $SF_6$.

4. A process as recited in claim 3 wherein said plasma is further formed, at least in part, from $CHF_3$.

5. A process as recited in claim 4 wherein said masking step includes masking with a resist material, and wherein said plasma is further formed, at least in part, from said resist material.

6. A process as recited in claim 4 wherein said etching of said first insulating layer forms sidewalls, and wherein the chemistry of the etching process causes a lateral build-up of a material derived from said plasma on said sidewalls.

7. A process as recited in claim 6 wherein said material is a polymer including carbon and sulfur derived from said plasma.

8. A process as recited in claim 7 wherein said step of etching said first insulating layer and said conductive layer comprises the step of removing said resist and said polymer after etching said conductive layer.

9. A process for making an integrated circuit structure comprising the steps of:
   providing a semiconductor substrate;
   forming a conductive layer over said substrate;
   forming an oxide layer over said conductive layer;
   masking said oxide layer with a resist material;
   etching said oxide layer with a plasma formed, at least in part, from $SF_6$ and $CHF_3$ such that, as said oxide layer is etched, sidewalls are formed on said oxide layer including a polymer deposited from said plasma;
   etching said conductive layer using said oxide layer and said sidewalls as a mask; and
   removing said resist and said polymer from said oxide layer,
   whereby a dimension of said etched oxide layer is less than a corresponding dimension of said etched conductive layer.

10. A process as recited in claim 9 further comprising the step of forming a blanket of an inter-layer dielectric over said etched oxide layer and said etched conductive layer.

11. A process as recited in claim 10 further comprising the step of forming a planarization layer over said inter-layer dielectric.

12. A process as recited in claim 11, wherein said inter-layer dielectric is an oxide layer, and said planarization layer is a spin-on-glass material.

13. A process as recited in claim 9 wherein the step of etching said oxide layer takes an amount of time in the range of about 30 to 300 seconds.

14. A process as recited in claim 13 wherein the step of etching said oxide layer takes an amount of time in the range of about 45 to 120 seconds.

15. A process as recited in claim 13 wherein the step of etching said oxide layer takes an amount of time in the range of about 65 to 75 seconds.

16. A process as recited in claim 15 wherein the step of etching said oxide layer includes the steps of:
   preparing an etching chamber with a chemistry required for said plasma, said preparing taking about 15 seconds;

performing a bulk etching step for about 20 seconds; and performing an overetch step for about 10 seconds.

17. A process as recited in claim 9 wherein said $CHF_3$ is provided by a gaseous flow of $CHF_3$ into a chamber enclosing said substrate at a $CHF_3$ flowrate in the range of about 80 to 800 standard cubic centimeters per minute and said $SF_6$ is provided by a gaseous flow of $SF_6$ into said chamber at a $SF_6$ flowrate in the range of about 8 to 80 standard cubic centimeters per minute.

18. A process as recited in claim 17 wherein said $CHF_3$ flowrate is in the range of about 180 to 190 standard cubic centimeters per minute and said $SF_6$ flowrate is in the range of about 14 to 16 standard cubic centimeters per minute.

19. A process as recited in claim 18 wherein said $CHF_3$ flowrate is about 185 standard cubic centimeters per minute and said $SF_6$ flowrate is about 15 standard cubic centimeters per minute.

* * * * *